United States Patent
Hsu

(10) Patent No.: US 7,265,053 B2
(45) Date of Patent: Sep. 4, 2007

(54) TRENCH PHOTOLITHOGRAPHY REWORK FOR REMOVAL OF PHOTORESIST RESIDUE

(75) Inventor: Jyh-Shiou Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 10/831,943

(22) Filed: Apr. 26, 2004

(65) Prior Publication Data
US 2005/0239290 A1    Oct. 27, 2005

(51) Int. Cl.
*H01L 21/302* (2006.01)
(52) U.S. Cl. .............. 438/689; 257/E21.483
(58) Field of Classification Search .......... 438/689, 438/700, 701, 702, 706, 707, 710
See application file for complete search history.

(56) References Cited

U.S. PATENT DOCUMENTS

| | | | |
|---|---|---|---|
| 5,783,100 A * | 7/1998 | Blalock et al. | 216/67 |
| 5,904,566 A * | 5/1999 | Tao et al. | 438/689 |
| 6,005,800 A | 12/1999 | Koch et al. | |
| 6,335,890 B1 | 1/2002 | Reohr et al. | |
| 6,490,217 B1 | 12/2002 | DeBrossee et al. | |
| 6,509,621 B2 | 1/2003 | Nakao | |
| 6,522,579 B2 | 2/2003 | Hoenigschmid | |
| 6,567,299 B2 | 5/2003 | Kunikiyo et al. | |
| 6,590,803 B2 | 7/2003 | Saito et al. | |
| 6,594,191 B2 | 7/2003 | Lammers et al. | |
| 6,621,731 B2 | 9/2003 | Bessho et al. | |
| 6,661,689 B2 | 12/2003 | Asao et al. | |
| 6,686,292 B1 | 2/2004 | Yang et al. | |
| 6,693,822 B2 | 2/2004 | Ito | |
| 6,693,826 B1 | 2/2004 | Black, Jr. et al. | |

OTHER PUBLICATIONS

Steve Lassig et al., "Selective Removal Strategies for Low k Dual Damascene", pp. 185-190, Semiconductor Fabtech.
JT Baker Microelectronic Materials, "Baker ALEG-625, Stripper/ Residue Remover", Aug. 2002, 4 pages, Lit. #4949, Technical Note, Mallinckrodt Baker, Inc.
Jerry Healey, "Current Technical Trends: Dual Damascene & Low-k Dielectrics", 2002, pp. 1-6, Threshold Systems.

\* cited by examiner

*Primary Examiner*—Scott B. Geyer
(74) *Attorney, Agent, or Firm*—Haynes and Boone, LLP

(57) ABSTRACT

The present disclosure provides a method for removing photoresist residue from a low k dielectric above a semiconductor substrate. The method includes creating a first opening in the low k dielectric extending a first depth towards an underlying conductor, and applying and patterning a material above the low k dielectric. In-situ first and second plasma environments are provided, with a bias power being applied to the substrate to attract ion bombardment during the second plasma environment. Trenches can be etched in the low k dielectric, the trenches extending a second depth less than the first depth. Material for the first and second plasmas and the ion bombardment are selected for removing residue of the material from the low k dielectric.

16 Claims, 4 Drawing Sheets

TRENCH PHOTOLITHOGRAPHY REWORK FOR REMOVAL OF PHOTORESIST RESIDUE

BACKGROUND

The present disclosure relates generally to the fabrication of semiconductor devices, and more particularly, to a method and system for the removal of photoresist residue from a semiconductor wafer.

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 micron and even 90 nm feature sizes.

Due to the ever shrinking design rules, changes have been made throughout the semiconductor manufacturing process. For example, strategies to minimize interconnect delays involve improving conductivity with copper wiring and lowering the dielectric constant (k) value by employing low k films. While copper integration is fairly advanced, low k materials present a wide range of new integration challenges because of their lower density, inferior mechanical properties, and typically increased organic content. In dual damascene applications, they are layered between a variety of other films. The number of stack combinations and requirements necessitate developing processes and process systems that are highly flexible and provide large processing windows.

Therefore, there is a need for an improved deposition process and reactor configuration that improves the uniformity of thin films produced by IMP.

BRIEF DESCRIPTION OF THE DRAWINGS

Features, advantages and objects of the present disclosure may be had by reference to the embodiments thereof which are discussed in the present specification and illustrated in the appended drawings. It is noted that the drawings are not to scale, and that reference numbers are repeated in the drawings for the sake of clarity, but do not by themselves indicate that certain elements are limited to the example or are otherwise required in any particular embodiment.

DETAILED DESCRIPTION

The present disclosure relates generally to the fabrication of semiconductor devices, and more particularly, to a method and system for the removal of photoresist residue from a semiconductor substrate. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail.

For the sake of example, a semiconductor substrate in the form of a silicon wafer will be described. In furtherance of the example, a dual damascene process utilizing a low k dielectric will be discussed. It is understood, however, that other examples can be equally derived from the benefits of the present disclosure.

Figure 1:
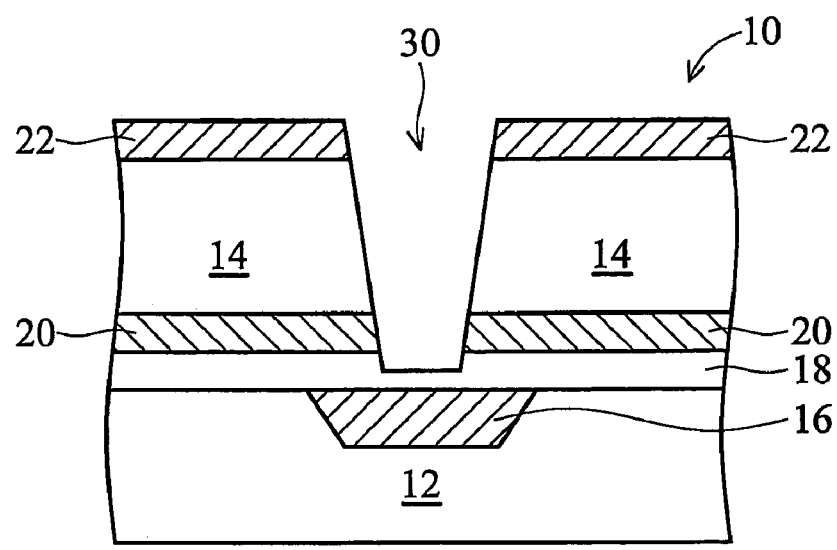
FIGS. 1-3 and 6-7 are cross-sectional views of a semiconductor substrate for implementing one or more embodiments of the present disclosure.
Figure 2:
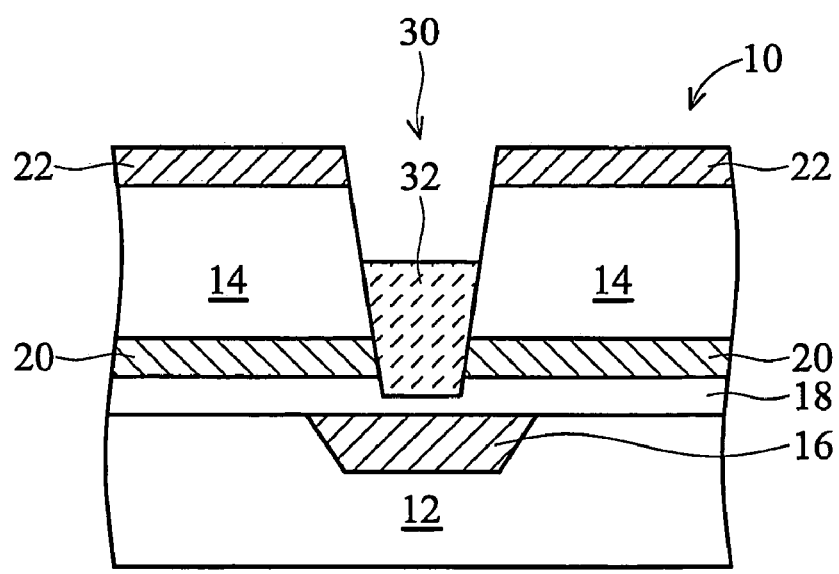

Referring to FIGS. 1-2, a silicon wafer 10 includes a plurality of low k dielectric layers 12, 14. The dielectric layers 12, 14 can be formed by many different procedures, including high density plasma (HDP). The dielectric layers 12, 14 may be comprised of fluorosilicate glass (FSG), carbon doped silicate glass (SIOC), organic polymer, and other types of material, and the layers 12, 14 do not necessarily need to be of the same type. The dielectric layer 12 includes a metal line 16, which in the present embodiment includes copper or copper alloy. Above the dielectric layer 12 is a silicon carbide (SiC) layer 18 and a tetraethyl orthosilicate (TEOS) layer 20. Above the TEOS layer 20 is the dielectric layer 14, and above it is a layer of silicon oxynitride (SiON) 22. It is understood that one or more intermediate layers may be included in various embodiments, and some layers may be missing altogether. For example, instead of the copper layer 16, a well or gate electrode can be used. Also, the arrangement of layers can be different in other embodiments, as would be well know by those of ordinary skill in the art.

Referring specifically to FIG. 1, in a first process, a hole 30 is formed for a via or contact. It is understood that reference to "process" can actually represent one or more different process steps or operations. These steps or operations may be dependent on the technology and layers being processed. In one embodiment, the first process may include a dry etch process operation and the SiC layer 18 serves as an etch stop. Also in the present embodiment, the hole 30 is the deep pattern of a dual damascene process operation. Although a "via first" dual damascene integration scheme is being described, other embodiments may use a "self-aligned" scheme or a "trench-first" scheme.

Referring specifically to FIG. 2, a photoresist plug (PR plug) 32 at the via hole 30 can remain after an ADI (after develop inspection) operation. In some embodiments, the PR plug 32 can act as a hard mask during later trench etching.

Figure 3:
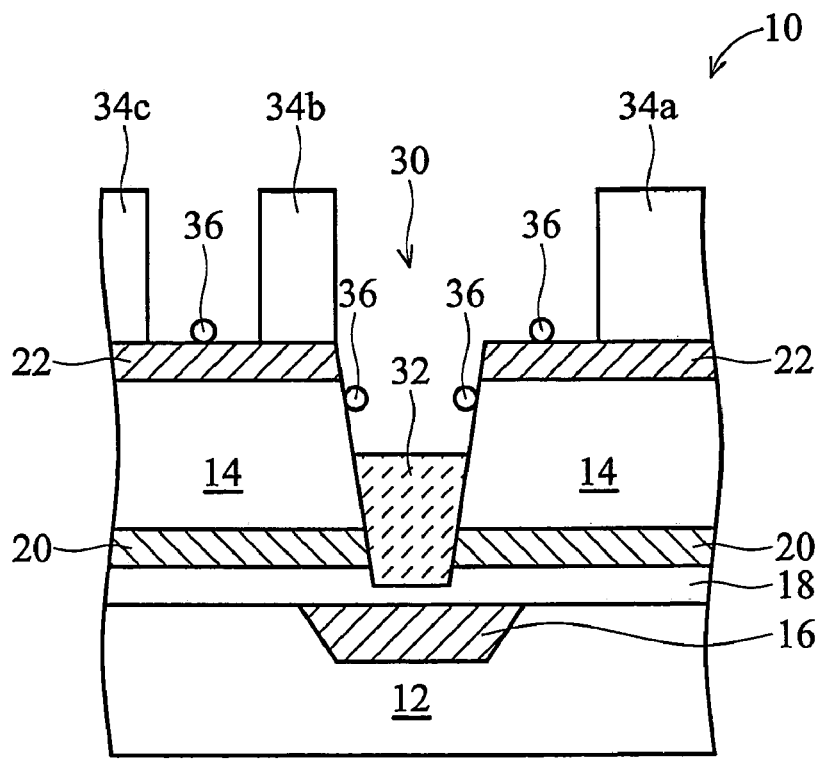
Figure 4:
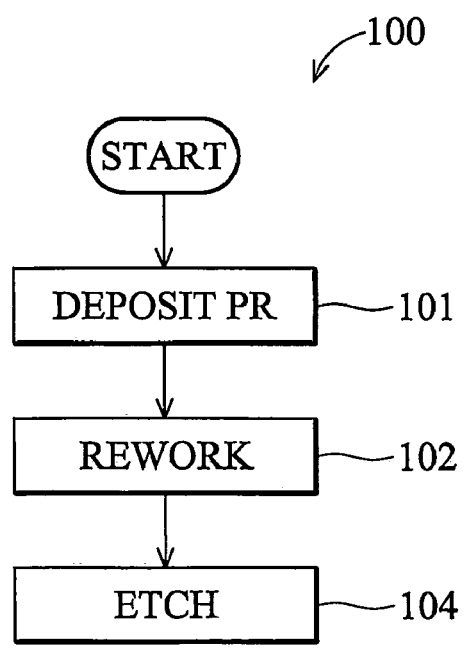
FIG. 4 is a flow chart describing a method according to one or more embodiments of the present disclosure.

Referring now to FIGS. 3 and 4, further progress of the wafer 10 (FIG. 3) will be discussed with reference to a unique process flow 100 (FIG. 4) according to one or more embodiments of the present disclosure. The process flow 100 begins at step 101, where a photoresist layer 34 is put down, exposed, and portions are removed. Remaining portions of the photoresist layer are designated with the numerals 34a, 34b, and 34c. In addition, films, ash, and residues 36 (collectively "residue") may be present on various parts of the wafer 10, including sidewalls of the opening 30.

At step 102, an improved photoresist rework process is performed on the wafer 10, including the via openings 30. The rework process is used for efficient positive and negative bulk resist removal as well as residue removal, including removal of the PR residue 36.

Figure 5:
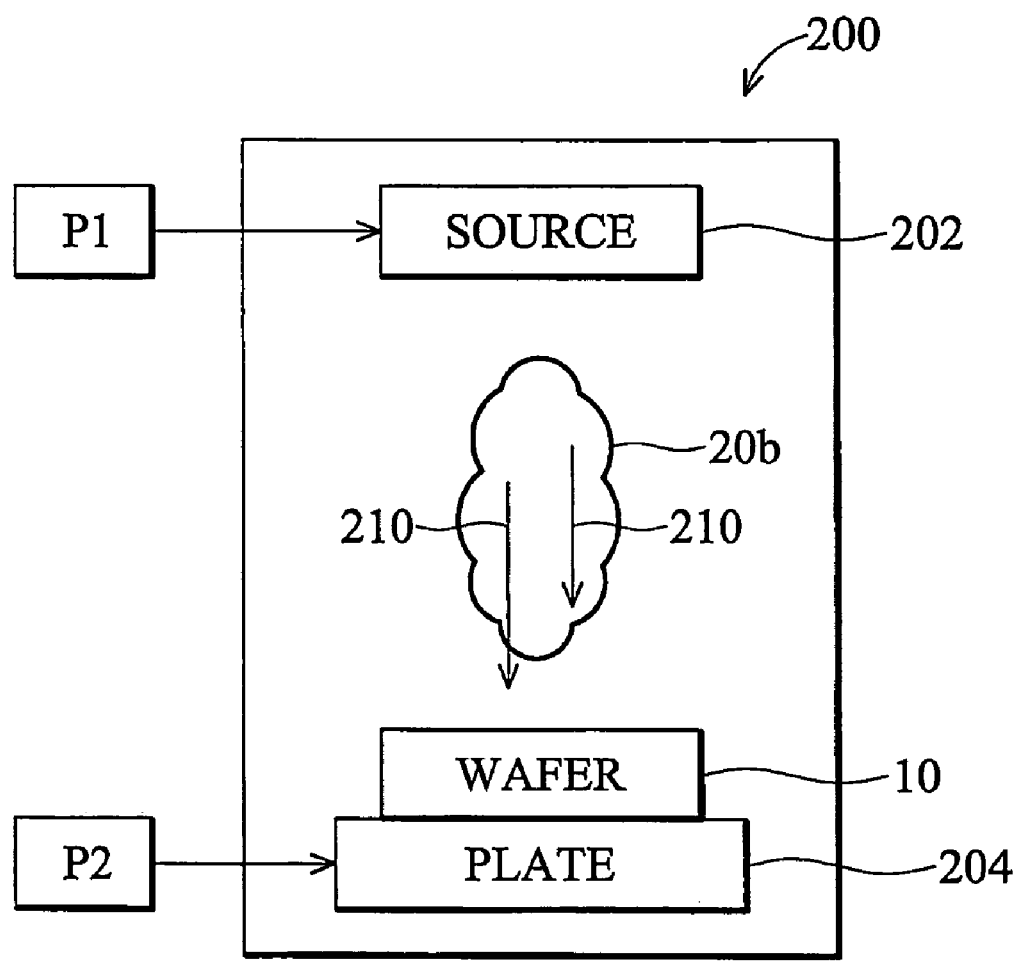
FIG. 5 is a diagram of processing chamber for implementing one or more embodiments of the present disclosure.

Referring also to FIG. 5, the rework process 102 can be performed in a variety of different chambers, such as a chamber 200. In one embodiment, the chamber 200 is a DRM Tiger chamber, provided by Tokyo Electron Limited (TEL) of Tokyo, Japan. The chamber 200 includes a plasma source 202 connected to a first power and material supply P1 and a plate 204 connected to a second power supply P2. The plasma source 202 is operable to create a plasma environment 206 according to a recipe of power and material.

At a first step of the rework process 102, the first power/material supply P1 provides a perfluorocarbon or tetrafluoromethane (CF4) and oxygen (O2) plasma 206 at 350 Watts(W) with a flow rate of 50 standard cubic centimeters per minute (sccm) CF4 and 800 sccm of O2. At a second step, the first power/material supply P1 changes the plasma 206 to an O2 and N2 plasma at 350 W with a flow rate of 150 sccm O2 and 10 sccm of nitrogen (N2). At a third step, the first power/material supply P1 changes the plasma 206 to an argon (Ar) and O2 plasma at 350 W with a flow rate of 150 sccm Ar and 100 sccm of O2. Also during this third step, the second power supply P2 provides a bias power of 300 W to the plate 204. Since the wafer 10 is sitting on the plate 204, the bias power supplied to the plate effectively applies the bias power to the wafer. The bias power causes an ion bombardment, represented by arrows 210, toward the plate 204 and thus towards the wafer 10. In another embodiment, a ring can be provided around the wafer 10 for receiving the bias power. Also, it is understood that the plate 204, ring, or other structure for receiving the bias power may or may not be in physical contact with the wafer 10, but is preferably positioned or otherwise configured to direct ion bombardment towards the wafer. For the sake of reference, these embodiments can be collectively referred to as applying the bias power to the wafer.

It is understood that the chamber 200 is illustrated in a simplified manner for the sake of clarity, and only a single wafer 10 is shown being processed. In other embodiments, the chamber 200 may include many more components and may support batch processing. It is also understood that the recipes discussed above are only examples, and that different recipes may be chosen without undue experimentation to meet desired processing conditions.

Figure 6:
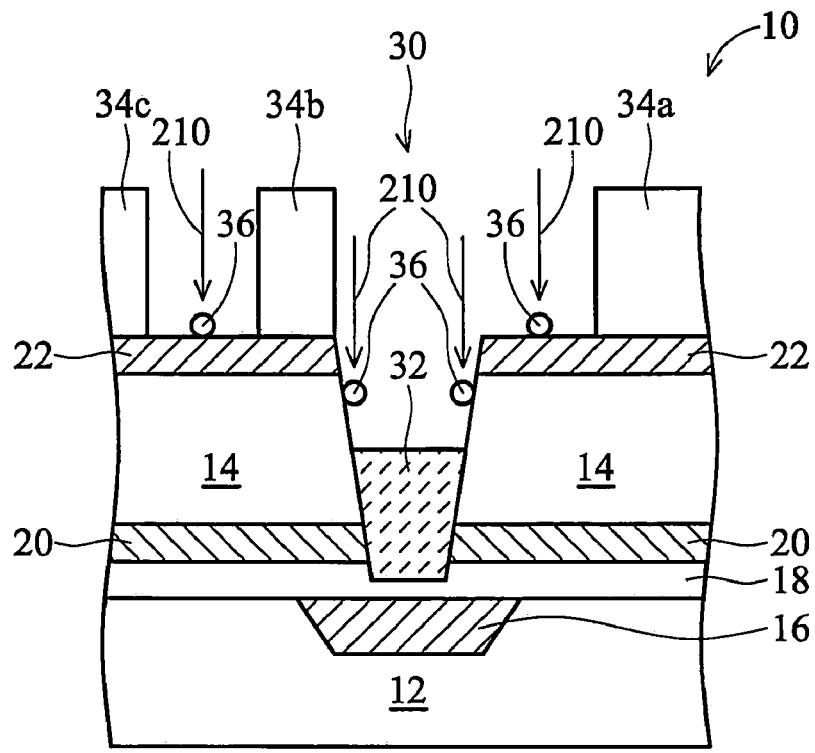

Referring now to FIG. 6, the ion bombardment 210 serves to remove a substantial portion of the residue 36. This bombardment 210 also preserves the material content of the low k dielectric 14. Since in the present embodiment this is done in-situ, throughput is maximized, overall manufacturing cost is reduced, and the profile of the hole 30 is maintained. Other embodiments may not be in-situ.

Figure 7:
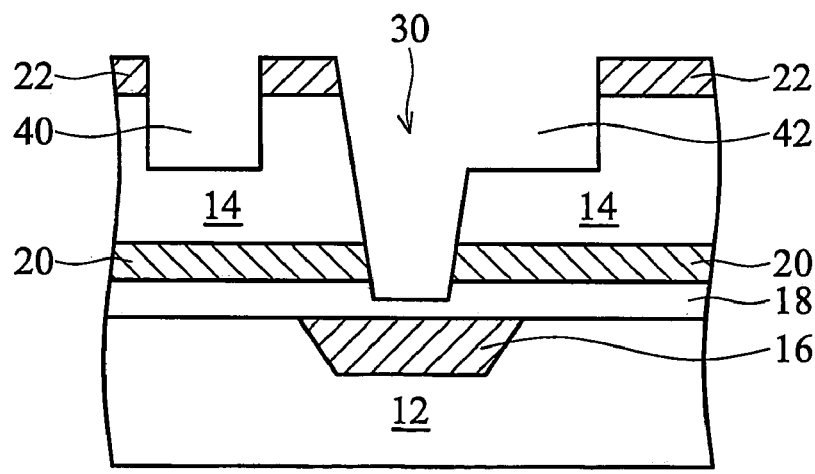

Referring now to FIGS. 4 and 7, at step 104 trenches for the dual damascene structure are etched into the low k dielectric 14. Although the trench etching is shown occurring after the rework step 102, in other embodiments the sequence may be reversed. Referring specifically to FIG. 7, trenches 42 are formed in the dielectric layer 14 and the photoresist 34 and PR plug 32 are removed. An in-situ trench etch and photoresist removal process can be used, or the processes can be carried out separately. Furthermore, a plasma chamber, such as the chamber 200 (FIG. 5) can be used to perform the trench etch 104.

Therefore, in one embodiment, a method for processing a semiconductor substrate includes applying a patterned photoresist to the substrate and performing a rework process on the substrate. The rework process includes providing a source power for creating a plasma environment and providing a bias power to the substrate for attracting ion bombardment towards the substrate. The method also includes performing an etching process according to the patterned photoresist.

In another embodiment, a method for making a dual damascene via opening includes providing a low k dielectric above a semiconductor substrate, creating a first opening in the low k dielectric extending a first depth towards an underlying conductor, and applying and patterning a material above the low k dielectric. In-situ first and second plasma environments are provided, with a bias power being applied to the substrate to attract ion bombardment during the second plasma environment. Trenches can be etched in the low k dielectric, the trenches extending a second depth less than the first depth. Material for the first and second plasmas and the ion bombardment are selected for removing residue of the material from the low k dielectric. Examples of such material include oxygen, nitrogen, and tetrafluoromethane.

In another embodiment, a method for performing photo rework for a low k dielectric substrate having photoresist residue is provided. The method includes performing a first plasma stripping process with an oxygen and a perfluorocarbon etching environment, performing a second plasma stripping process with an oxygen and nitrogen etching environment, and performing a third plasma stripping process with an oxygen and argon environment while providing a bias power to the low k dielectric substrate. In some embodiments, the first and second plasma stripping processes are performed at about 350 Watts, the third plasma stripping process is performed at about 500 Watts, and the bias power is provided at about 300 Watts. In some embodiments, the first plasma stripping process provides the perfluorocarbon with a flow rate of about 50 standard cubic centimeters per minute (sccm) and the oxygen with a flow rate of about 800 sccm. In some embodiments, the second plasma stripping process provides the oxygen with a flow rate of about 150 sccm and the nitrogen with a flow rate of about 10 sccm. In some embodiments, the third plasma stripping process provides the argon with a flow rate of about 150 sccm and the oxygen with a flow rate of about 100 sccm.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure

I claim:

1. A method for processing a semiconductor substrate, comprising:
   applying a patterned photoresist to the substrate;
   performing a rework process on the substrate, the rework process comprising providing a source power for creating a plasma environment and providing a bias power to the substrate for attracting ion bombardment towards the substrate; and
   performing an etching process according to the patterned photoresist;
   wherein the plasma environment includes argon and oxygen.

2. The method of claim 1 wherein the rework process further comprises providing a first preliminary source power for creating a preliminary plasma environment.

3. The method of claim 2 wherein the first preliminary plasma environment includes at least one of either perfluorocarbon or oxygen.

4. The method of claim 2 wherein the first preliminary plasma environment includes at least one of either nitrogen or oxygen.

5. The method of claim 1 wherein the bias power is provided to a plate adjacent to the substrate.

6. A method for processing a semiconductor substrate, comprising:
   applying a patterned photoresist to the substrate;
   performing a rework process on the substrate, the rework process comprising providing a source power for creating a plasma environment and providing a bias power to the substrate for attracting ion bombardment towards the substrate; and
   performing an etching process according to the patterned photoresist;
   wherein the rework process further comprises providing a first preliminary source power for creating a first preliminary plasma environment and a second preliminary source power for creating a second preliminary plasma environment, wherein at least one of the first or second preliminary plasma environments includes oxygen.

7. The method of claim 6 wherein at least one of the first and second preliminary plasma environments includes.

8. The method of claim 6 wherein the rework process wherein a bias power is not applied to the substrate when at least one of the first or second preliminary plasma environments is being provided.

9. A method for making a dual damascene via opening, comprising:
   providing a low k dielectric above a semiconductor substrate;
   creating a first opening in the low k dielectric extending a first depth towards an underlying conductor;
   applying and patterning a material above the low k dielectric;
   providing a first plasma environment;
   providing a second plasma environment in-situ with the first plasma environment;
   applying a bias power to the substrata to attract ion bombardment during the second plasma environment; and
   etching trenches in the low k dielectric, the trenches extending a second depth less than the first depth;
   wherein material for the first and second plasmas and the ion bombardment are selected for removing residue of the material from the low k dielectric.

10. The method of claim 9 wherein the first plasma environment uses at least one of the materials from the group of oxygen, nitrogen, and tetrafluoromethane.

11. The method of claim 9 wherein the first plasma environment sequentially uses CF4 material and nitrogen material.

12. The method of claim 9 wherein the second plasma environment uses at least one of the materials from the group of oxygen and argon.

13. The method of claim 9 wherein the first plasma environment is produced from a first source power and the second plasma environment is produced from a second source power greater than the first source power.

14. The method of claim 13 wherein the first source power is about 350 Watts and the second source power is about 500 Watts.

15. The method of claim 13 wherein the second source power is greater than the bias power.

16. The method of claim 15 wherein the first source power is about 350 Watts, the second source power is about 500 Watts, and the bias is about 300 watts.

* * * * *